United States Patent [19]
Weresch

[11] 4,367,775
[45] Jan. 11, 1983

[54] APPARATUS FOR CUTTING TO SIZE AND BENDING LEADS OF ELECTRICAL COMPONENTS

[76] Inventor: Thomas Weresch, Greschbachstr. 19, D-7500 Karlsruhe 41, Fed. Rep. of Germany

[21] Appl. No.: 204,517

[22] Filed: Nov. 6, 1980

[30] Foreign Application Priority Data

Nov. 6, 1979 [DE] Fed. Rep. of Germany ....... 2944666

[51] Int. Cl.³ .............................................. B21F 45/00
[52] U.S. Cl. ................................................. 140/105
[58] Field of Search .............................. 140/71 R, 105

[56] References Cited

U.S. PATENT DOCUMENTS 2,934,098 4/1960 Strauss .............................. 140/71 R
3,540,494 11/1970 Susong ................................. 140/105
4,166,312 9/1979 Harigane et al. ..................... 140/105

Primary Examiner—Lowell A. Larson
Attorney, Agent, or Firm—Antonelli, Terry & Wands

[57] ABSTRACT

An apparatus for cutting to length and bending leads of electrical components has transport toothed wheels and bending toothed wheels, which are keyed on a common shaft and used with cutting tools and bending tools. Furthermore, there are gripping toothed wheels, acting with the bending toothed wheels, for stopping pulling forces acting on the components. Next to each bending toothed wheel, there is an arm, turningly supported on a further shaft and which is acted upon by a spring pulling it towards the main shaft. The gripping toothed wheels and the bending tool are supported on these arms. The apparatus designed on these lines may simply be retooled for different processing operations and in all cases makes certain that, on bending, the components are not acted upon by undesired pulling forces. The apparatus may be used for electrical components such as diodes, resistors and transistors, in the case of which the leads are generally in line and placed at the opposite ends of the components.

13 Claims, 3 Drawing Figures

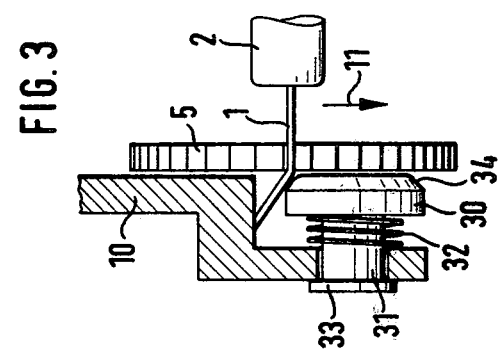
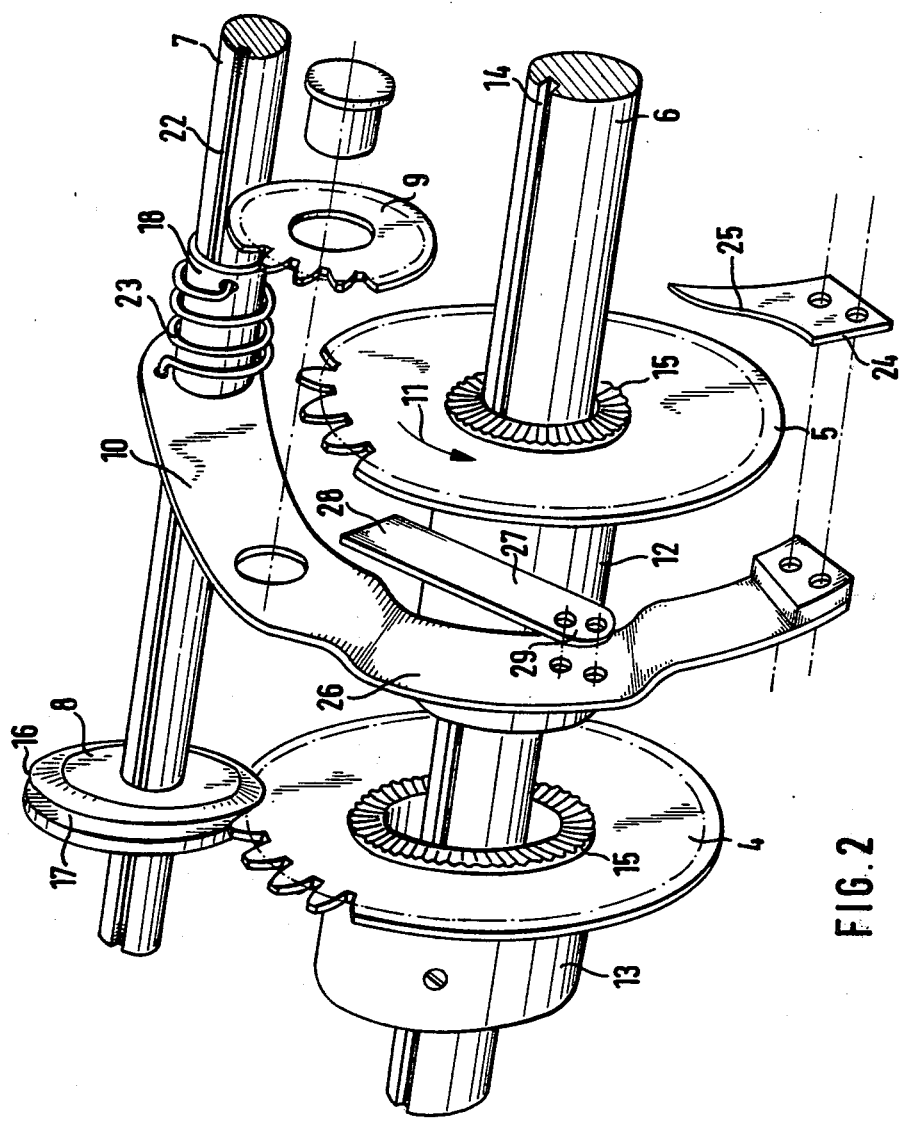

APPARATUS FOR CUTTING TO SIZE AND BENDING LEADS OF ELECTRICAL COMPONENTS

BACKGROUND OF THE INVENTION

The present invention relates to an apparatus for cutting to size and bending leads of electrical components, with the apparatus having transport toothed wheels for taking up leads between their teeth and bending toothed wheels, all such wheels being keyed on a driving main shaft supported by bearings in a support structure, cutting tools designed for use with the transport toothed wheels, bending tools designed for use with the bending toothed wheels, gripping toothed wheels elastically forced against the bending toothed wheels and meshing therewith, and with a further shaft, parallel to said main shaft, for supporting said gripping toothed wheels.

An apparatus is normally used for operations on the leads of electrical components such as resistors, capacitors, and diodes which, as a rule, but not necessarily, have two lead wires at opposite ends of the component and are normally in line with each other and with the axis of the component. Such components may or may not be connected together by belts of adhesive tape. Generally, such components come from the manufacturer in a form, in which the user is not readily able to put them directly into the circuit: The leads are generally more or less straight and, as a rule, are very much longer than needed for use in the circuit. For this reason, they have to be cut down to size and bent. Furthermore, for use in printed circuit boards or the like, such components have to be kinked so as to have a sort of "feet" with which they may be kept in the holes in a circuit board safely till soldering takes place. The designs of the bends and of the kinks do not have to be detailed here.

In a prior apparatus of the aforementioned type such as, for example, see German Pat. No. 2,030,818, British Pat. No. 1,414,234 and U.S. Pat. No. 3,900,053, the cutting to length and bending of the leads, and, possibly, if needed, kinking, takes place at a very high throughput rate as if it were only a question of a single working step.

In this respect the components, supported in the tooth spaces of toothed wheels placed coaxially in line, are moved past the tools for being cut to length, bent, and, if necessary, kinked. In this respect normally, for each lead wire, a complete toothed wheel group with transport, bending and, if necessary, kinking toothed wheels is present, which are used with stationary tools which, in a way dependent on their placing in the apparatus, take effect at different points in time, shortly one after the other, dependent in the way in which they are placed at the outer edges of the toothed wheels and their direction of turning.

To make certain that, when bending takes place, the body of the component is not acted upon by any pulling forces by which the leads might be pulled loose and the components damaged, the leads are gripped on bending between the position of bending and the body of the component. This is undertaken in apparatus of the sort in question by grippers in the form of toothed wheels, which, in the present invention, are named gripping toothed wheels and are naturally supported so as to be able to be freely turned so that they may be meshed with the bending toothed wheels. The wires are, in this respect because of the springing force acting on the gripping toothed wheels, gripped at the points of the teeth against the roots of the teeth of the bending toothed wheels. In the prior art apparatus, the gripping toothed wheels are supported by bearings on the said further shaft itself, which, for its part, is spaced from the main shaft in the housing. The spring system for acting on the gripping toothed wheels is, in this case, produced by a spring acting eccentrically on the further shaft.

This prior art apparatus of the sort in question will still be seen to have some shortcomings from different points of view. In general use in the trade, it is regularly necessary, on retooling for making different circuits with different components, not only for the toothed wheels, but furthermore the tools to be moved along the main shaft, dependent on the lengths coming into question, and then fixed in position. The adjustment of the toothed wheels is made possible because each wheel is joined to its own bush and the bushes may be pushed along the main shaft and being keyed to it. On retooling, the bending tools and the gripping toothed wheels have to undergo separate adjustment, this taking up much working time. Furthermore, because the gripping toothed wheels are supported by bearings on the further shaft as well, that is to say the shaft in addition to the main shaft, in the old apparatus, the gripping toothed wheels may not undergo adjustment separately to be in line with the lead with which the apparatus is to be used and, in fact, they are moved out of position to the same degree against the spring force. In trade use, however, it may be frequently the case that the leads of a component are differently curved or bent so that the gripping toothed wheels are moved out of position by the leads different amounts with the outcome that the other lead of a component is no longer positioned in the desired way.

Furthermore, for cutting to length, kinking and/or bending the wires of electrical components, further forms of apparatus of the general sort noted have been put forward (see German Pat. No. 2,256,290), using only a single shaft and, in place of gripping toothed wheels for use with the bending toothed wheels, finger-like grippers for limiting pulling forces on the component body are used which are springingly supported on the housing and come into play with the bending tools. In the case of this form of apparatus of a different sort, and which has been found to be more specially useful on processing thick leads, separate adjustment of the grippers and bending tools is necessary on retooling.

BRIEF SUMMARY OF THE INVENTION

One purpose of the present invention is that of designing an apparatus of the sort noted, which may be produced simply and readily, may simply be retooled for different operations in the trade and makes certain, in all cases, of gripping of the leads so that pulling forces acting thereon do not have any undesired effects on the component body.

This and other purposes are effected by the invention in that, for each bending toothed wheel there is an arm rotatably supported on the further shaft, and a spring system for elastically moving the arm towards the main shaft and the gripping toothed wheels and the bending tools acting on the arms.

By placing the gripping toothed wheels each on its own separate arm, which is able to be turned in relation to the further shaft (and naturally placed eccentrically in relation to the further shaft), it is possible to make certain that the gripping toothed wheels may undergo adjustment separately from each other as may be needed in view of the leads to be processed so that, in all cases, the component bodies are not acted upon by any pulling forces by way of the leads. The placing not only of the gripping toothed wheels, but furthermore of the bending tools on the arms, makes it possible for them to undergo adjustment together, to be in line with the changed position of the bending toothed wheels, when retooling takes place, the retooling process then being much less complex. A further useful effect is produced because the bending tools and, furthermore, the gripping toothed wheels are controlled together in a way dependent on the thickness and position of the lead wire to be bent, so that in a bending process the leads are all bent and formed in the same way. The gripping toothed wheels are naturally rotatably supported on the arms, such rotatable motion generally, though not necessarily, being about an axis parallel to the main shaft.

In the observations so far, a discussion has more specially been made of operations on cutting to length and bending of leads: naturally, in the case of an apparatus of the present invention it is furthermore possible to have further kinking toothed wheels of the sort used in German Pat. No. 2,256,290 as well, which are used with their own kinking tools. It is best for such tools to be designed as single units with the cutting tools to take the form of combined cutting and kinking tools.

With respect to details, the invention makes possible a great number of useful further developments of the apparatus. The apparatus is very strong so that even very thick lead wires may be processed and furthermore, because the apparatus is short in the axial direction, short bent lengths may be produced because the arms are generally plate-like and placed to the side of the bending toothed wheels with which they are used, generally in a plane normal to the main shaft. Such arms are joined up with a bush at their ends, named bearing ends, the bushes being able to be moved along the further shaft. The arms may, for example, be made by stamping and bending sheet metal. The arms may be axially fixed in position for example by way of gripping rings on the further shaft. More specially, the arms are, however, hooked or U-shape at their ends (that is to say at their free ends) furthest from the further shaft, the hooked ends having guide cheekpieces, facing the side of the bending toothed wheel which is turned away from the rest of the arm. On axial adjustment of the bending toothed wheels, in this respect, the arms are moved along together with the bending toothed wheels so that separate adjustment is not then necessary.

The spring system for acting on the arms may be designed in a number of different ways. In one design, the spring acting on the arm for moving it towards the main shaft, has one end joined up with a rod, parallel to the main shaft, so that it (the spring) may be moved axially along the rod, use being made, for example, for this purpose, of a sliding bush placed on the rod so that the bush is moved as well when axial adjustment of the arm takes place. In another possible design, in which a separate rod is not necessary, the arm is supported by bearing on a bush which is keyed on the further shaft so that it may be moved therealong and the spring, forcing the arm towards the main shaft, is in the form of a torsion spring joined up with the bush. The bush may be keyed in the normal way on the further shaft, the key in the form of a pin running into a key-way in the further shaft.

For the bending operation a useful effect is to be produced if the bending tools are designed so as to give way elastically when acted upon by forces acting in the axial direction to the main shaft, so that the leads are let through between the bending tool and the bending toothed wheel after the bending operation. This may be made possible, for example, by the bending tools' being made up of bending rollers which are journaled on the arms and may be yieldably moved axially against a spring force acting for pushing the bending tool in question towards the bending toothed wheel. The bending rollers may have a conical chamfer at their bending face for stopping any uncontrolled forces being produced on bending and are, in any case, so placed that the leads are guided against the bending rollers at the position at which the bending and gripping toothed wheels are in mesh.

Another way of elastically supporting the bending tools is a design in which the bending tools take the form of generally long rails, for example, with a length of the same order as the radius of the bending toothed wheels, the rails having working ends taking effect on the leads at the position of mesh of the bending and gripping toothed wheels, the rails being joined to the arms with a fixing end at some distance from the working end in each case. Because the bending tool and its arms may be elastically bent, the desired elastic change in position of the bending tool in relation to the bending toothed wheel is made possible. In any case, with this elastically yielding design, it is possible to make certain that the forces, produced on the bending operation, do not have any undesired effects on the operation of the gripping toothed wheels.

It has been made clear in the present account how retooling operations on an apparatus of the present invention may be made very much more readily possible because the bending tools and the gripping toothed wheels may be axially adjusted, preferably together with the bending toothed wheels. From this point of view, the design is furthermore to be such that the scissors or shearing tools are automatically moved on adjustment of the transport toothed wheels. This may be made possible if the scissors for shearing tools are designed as scissors rollers or shear rollers, which may be turned and axially moved on the further shaft, with circumferential scissors or shearing edges and if the transport toothed wheels are designed so that their edges are taken up in circumferential grooves of the scissors rollers next to the scissors or shearing edges.

After a bending operation, normally, the components are kept in position by the leads' elastically gripping the bending toothed wheels. In order to make certain that the components are freed from the apparatus after processing, it is furthermore possible, as part of the invention, for at least one of the arms, at a part far from the further shaft, to be designed as an output unit for the components with an outwardly and upwardly sloping guide face. The lead wires are then guided on the sloping face, on turning the bending toothed wheels, and moved by the face clear of the spaces between the teeth. Preferably, the arms, together with the bending tools, are placed at the outer side, facing away from the next bending toothed wheel, of the bending toothed wheels. The sloping guide faces are, in this respect, on the guide cheekpieces (next to the inner sides of the bending toothed wheels) of the arms.

With a view to making certain of trouble-free guiding of components or wires, it is best for the arms to be curved in the form of parts of circles with an inner limiting edge the same in form as the outer edges of the bending toothed wheels and, furthermore, in the part opposite to the guiding face, there is an inwardly dished part of the arm, concave towards the bending toothed wheel, such dished part being for example angled and being designed for letting through or letting past the bent lead ends.

BRIEF DESCRIPTION OF THE DRAWINGS

An account will now be given of some working examples of the invention making use of the figures.

FIG. 2 is a part, exploded view of a somewhat modified form of the apparatus of FIG. 1.

FIG. 3 is a view of part of another working example of the apparatus of FIG. 1.

DETAILED DESCRIPTION

Figure 1:
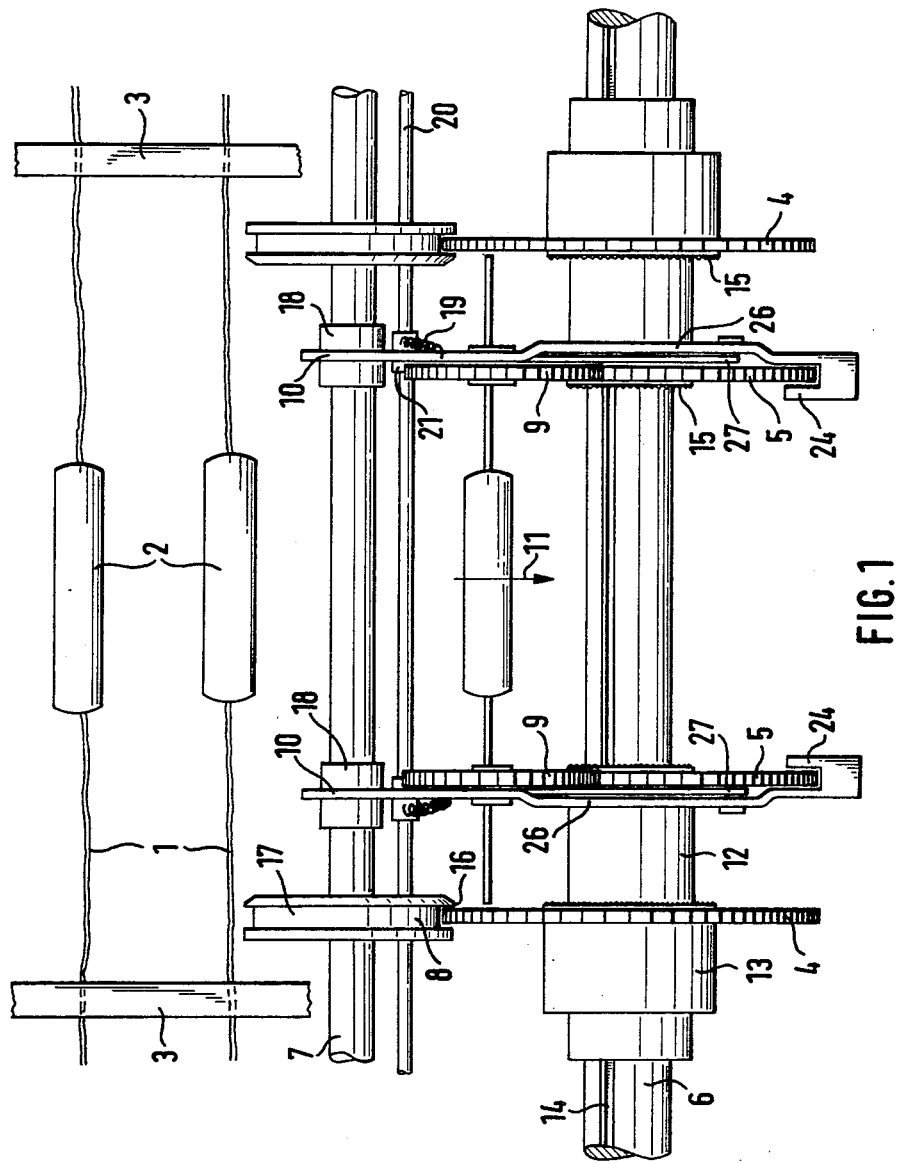
FIG. 1 is a simplified view of an apparatus for cutting to length and bending the leads of electrical components.

The apparatus to be seen in the figures is used for cutting to length and bending connection leads 1 of electrical components which may be, in the present working example, resistors 2, which are joined together by adhesive tapes 3 to take the form of a belt or chain of such components.

For processing each lead 1, two wheels, that is to say transport toothed wheel 4 and bending toothed wheel 5 are used. All toothed wheels 4 and 5 are coaxial with respect to each other and are adapted to be turned by way of a common main shaft 6. The toothed wheels 4 and 5 are so placed on main shaft 6 that they may not be turned freely with respect thereto and, in fact, are keyed on main shaft 6, for example, by a pin, a thread-free end screw, or the like, extending into a key-way 14. Parallel to main shaft 6, a second or further shaft 7 is supported in a housing (not shown) of the apparatus. Transport toothed wheels 4 are designed and positioned for use with cutting tools, each in the form of a scissors or shear roller 8 which, in each case, is supported on the second shaft 7 so that it may be turned with respect thereto and moved along the second shaft 7 in an axial direction, that is, the cutting tools are placed loosely on second shaft 7. A more detailed account of the bending tools used with the bending toothed wheels 5 will be given later.

Although this part of the mechanical design is not shown in the figures, the apparatus may additionally be used for forming kinks on the connection leads 1, this being done by making use of two kinking toothed wheels, of which one is placed to the side of each transport toothed wheel 4, and by so changing the design of the scissors or shear rollers 8 by the presence of a kinking groove that such scissors or shear rollers 8 take the form of cutting and kinking tools of the type described, for example, in U.S. Pat. No. 3,900,053 (which is the same in substance as German Pat. No. 2,256,290 and German Pat. No. 2,030,818).

All toothed wheels or gearwheels noted so far have the same tooth spacing and, more specifically, the same tooth form and are so keyed on main shaft 6 that the spaces between the teeth are in line with each other.

When bending takes place, pulling forces may be produced which act on the connection leads 1, and for stopping the undesirable effects of such pulling forces on the component bodies, gripping toothed wheels 9 are used, which are elastically forced against the bending toothed wheels 5 meshing therewith. The necessary spring force is produced by way of spring 23 (FIG. 2). Each gripping toothed wheel 9 is supported by bearings on its own arm 10, which, is pivotably supported on the further shaft 7, loaded by way of spring 23, in a manner described more fully hereinbelow, towards main shaft 6. The arm 10 is furthermore used for bending tools, as will be described hereinbelow.

Generally, the apparatus of the figures is so operated that the component's connection leads 1 are placed in the tooth spaces of toothed wheels 4 and 5 and are moved by the wheels in the direction 11 of turning motion through the apparatus past the cutting and bending tools, with the processing of the connection leads 1 being undertaken by the toothed wheels 4, 5 acting with their tools. By the placing of the tools, such operations on the connection leads 1 take place one after the other, the timing being such that the connection leads 1 are first cut to length or size by transport toothed wheel 4 and scissors or shear roller 8 and, at the same time, are separated from adhesive tapes 3 of the belt and are then bent between each bending toothed wheel 5 and its associated bending tool. On further turning of the toothed wheel 4, the components 2 to be processed are freed and discharged from the apparatus.

For getting the apparatus ready for processing different component sizes, and different sorts of processing, the toothed wheels 4 and 5 are able to be adjusted in the axial direction of main shaft 6 and then fixed in their new positions. For this purpose, the bending toothed wheels 5 are fixed to the ends or radial faces of inner sleeves or bushes 12, which are able to be axially displaced along main shaft 6 and to be keyed thereon by the axial key-way 14. Such keying may take place, for example, by a screw, radially extending through the sleeve or bush 12 and having a thread-free end sticking out into key-way 14. The transport toothed wheels 4 are furthermore fixed to the end radial face of a separate outer sleeve or bush 13, which is able to be axially displaced along the inner bush 12 and may be keyed thereon, for example, by way of the locking screw, a head of which is shown in FIG. 2. Fixing toothed wheels 4 and 5 on bushes or sleeves 12 and 13 may be accomplished by crimping a collar at the radial ends of the bushes or, as shown in FIG. 2, by way of a knurled neck part 15, with such a construction decreasing the overall depth of the apparatus and making possible very short bending lengths. Further keying to stop a twisting of the toothed wheels 4, 5 may be undertaken by pins running through the toothed wheels 4, 5 into the bushes 12, 13.

The transport toothed wheels 4 are each designed for running into a circumferential groove 17 at the scissors or shear edge 16 of scissors or shear rollers 8 so that the latter are automatically moved axially when transport toothed wheels 4 are so moved.

As will be seen from the figures, the arms 10 take the form of stamped and bent sheet metal parts or pressings, which are generally plate-like and may be made up of a flat piece of sheet metal bent into the desired form. The arms are placed, in each case, to the side of the bending toothed wheel 5 and generally in a plane normal to main shaft 6. Arms 10 are joined up with a support bush 18 at their supported ends, such bushes 18 being able to be axially displaced along the further shaft 7. In the working example of FIG. 1, the arm 10 is, in each case, elastically pushed towards the main shaft 6 by way of a tension coil spring 19, which, at one end, is fixed to arm 10 and at the other end to a rod 20, extending in parallel to the main shaft 6. Springs 19 are connected with rod 20 by way of runner bushes 21. In this respect, arms 10 and support bushes 18 may be fixedly joined to each other and be adapted to be freely turned about second shaft 7.

In the working example in FIGS. 2, the arm 10 is turningly joined up with the bush 18 and the bush 18 is able to be freely axially displaced along second shaft 7, on which it is keyed by a pin extending into an axial key-way 22 in shaft 7. The arm 10 is pushed in a direction of the main-shaft 6 by a torsion spring 23, joined up with bush 18.

The arms 10 have guide cheekpieces 24 at their free ends, which are furthest from second shaft 7. These free ends are hooked or U-shaped. The guide cheekpieces 24 are placed opposite and facing sides of the bending toothed wheel 5 in question, opposite to the sides nearest arms 10. Putting it differently, it may be said that arms 10 have their free ends hooked around the bending toothed wheel 5 in question and, when the latter undergoes axial adjustment, they are readily moved as well together with gripping toothed wheels 9 and the bending tools.

In the working example of the invention showed in the figures, the arms 10 together with the bending tools to be described hereinbelow are, in each case, placed on the outer side, facing away from the other bending toothed wheel, of the bending toothed wheels 5 so that guiding cheekpieces 24 are opposite to the inner side of bending toothed wheel 5. Arms 10 are generally curved, that is to say they have the form of parts of circles, their inner edges or outlines answering or corresponding to the outer edge of the bending toothed wheels 5. In the part furthest from the second shaft 7, that is to say at guide cheekpieces 24, as shown most clearly in FIG. 2, the arms 10 have an upwardly sloping guide face 25, that is to say sloping upwards in the direction 11 of turning motion for the purpose of lifting components 1 clear of the spaces between the teeth of bending toothed wheels 5 and pushing them clear of the apparatus. In the part, opposite to the guiding face 25, the arms 10 are so bent that there is a dished part 26, hollow towards the bending toothed wheel 5 in question and designed for letting through the bent wire leads 1 of the components.

The bending tools are, as has been made clear, in each case placed on arms 10, the placing being such in the working embodiments illustrated that they elastically yield when acted upon by forces in the axial direction of main shaft 6, and, for this reason, allow the connection leads 1 to pass after the bending operation. In the case of the embodiment illustrated in FIGS. 1 and 2, the bending tools are designed in the form of rails 27, whose length is generally equal to the radius of the bending toothed wheels 5 and whose working ends 28 are placed at the position of meshing of the bending and gripping toothed wheels 5 and 9 for acting on leads 1. Rails 27 are at their other, fixing ends 29 joined to the arms 10 in each case within the concave dished part 26 so that, while making certain that the structure takes up little space, they are kept clear of bending toothed wheels 5. Rails 27 and arms 10 are bent elastically as the bent wire or lead ends are moved through the apparatus.

In the case of the working example to be seen in part in FIG. 3, the bending tools are made up of bending rollers 30 supported by way of bearing pins 31 on arms 10 and, against the force of a spring 32 pushing them towards the bending toothed wheel 5 in question, they may be moved on arm 10. By way of a stop ring 33 on pin 31, it is possible to make certain that the bending rollers 30 do not have any braking effect on, or are kept clear of, bending toothed wheels 5.

The bending roller 30 is conically chamfered at its bending edge 34, as is the case with rail 27 at working end 28 thereof. For this reason, the bending operation takes place smoothly without any sudden, uncontrolled forces.

I claim:
1. In an apparatus for cutting to size and bending leads of electrical component, the apparatus comprising: transport toothed wheel means for taking up leads between teeth thereof, bending toothed wheel means, all of said wheel means being keyed on a main driving shaft means supported by bearings in a supporting structure; cutting tool means for use with the transport toothed wheel means; bending tool means for use with the bending toothed wheel means, gripping toothed wheel means elastically acted upon for meshing with said bending toothed wheel means; and a further shaft means, parallel to said main driving shaft means, for supporting said gripping toothed wheel means, wherein the improvement comprises a plurality of arm means, each of said plurality of arm means is rotatably supported by said further shaft means, said arm means being equal in number to a number of bendinhg toothed wheel means and constructed for use therewith, and a spring means for urging each of said arm means in a direction of said main shaft means, and wherein said gripping toothed wheel means and said bending tool means are supported on said arm means.

2. An apparatus according to claim 1, wherein said arm means are generally plate-like and are disposed in planes located to a side of each one of the bending toothed wheel means associated with the respective arm means, each of said planes being arranged to as to extend generally normal to said main shaft means, and bush means fixed to a first end of each of said arm means slidably supported on said further shaft means for axial displacement therealong.

3. An apparatus according to one of claims 1 or 2, wherein hook-shaped guide means are disposed at a second end of each of the arm means said hook-shaped guide means extend around an edge of the associated bending toothed wheel means.

4. An apparatus according to one of claimes 1 or 2, further comprising a rod disposed in parallel to said main shaft means, and wherein the spring means for moving the arm means towards the main shaft means includes springs having ends coupled with said rod.

5. An apparatus according to one of claims 1 or 2 further comprising a bush means mounted on said further shaft means in a manner so as to be movable therealong for forming a bearing for each of said arm means, said spring means being coupled to said bush means.

6. An apparatus according to one of claims 1 or 2, wherein said bending tool means are constructed so as to be elastically yieldable on being acted upon by forces acting in an axial direction of said main shaft means.

7. An apparatus according to any one of claims 1 or 2, further comprising bending roller means rotatably supported by bearing means on each of said arm means, said bending roller means forming said bending tool means.

8. An apparatus according to claim 7, further comprising spring means for urging the bending rollers in a direction of the associated bending toothed wheel means, and wherein said bending roller means are movable in an axial direction against a spring force of said last-mentioned spring means.

9. An apparatus according to one of claimes 1 or 2, wherein said bending tool means are constructed as rail means, said rail means each including a working end for acting on the leads, the working end being disposed near a position at which teeth of said bending and gripping toothed wheel means are in mesh, and wherein the rail means are fixed on said arm means at positions opposite to the working ends.

10. An apparatus according to one of claims 1 or 2, wherein said cutting means includes scissors rollers rotatably and axially displaceably positioned on said further shaft means, the scissors rollers each including an outer cutting edge and a circumferential groove for accommodating an outer edge of the transport toothed wheel means.

11. An apparatus according to one of claims 1 or 2, wherein means are provided on at least one of the arm means at a distance from said further shaft means for discharging the electrical components from the apparatus, said last-mentioned means including an upwardly sloping guide face means.

12. An apparatus according to claim 11, wherein each of the bending toothed wheel means includes a first side facing an adjacent bending toothed wheel means and an opposite outer side, and wherein the arm means and bending tool means are positioned on the outer side of the respective bending toothed wheel means, and the sloping guide face means are on guide means provided on said arm means.

13. An apparatus according to one of claims 1 or 2, wherein the arm means are formed of generally curved-like parts of circles, inner limits of the arm means are substantially in line with outer contours of the bending toothed wheel means, and wherein each of said arm means includes an inwardly dished part concavely facing the bending toothed wheel means in an area opposite the sloping guide face means.

* * * * *